United States Patent
Ando

(10) Patent No.: US 8,735,196 B2
(45) Date of Patent: May 27, 2014

(54) METHOD OF MANUFACTURING NITRIDE SEMICONDUCTOR LIGHT EMITTING DEVICE

(75) Inventor: Masanobu Ando, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 13/410,773

(22) Filed: Mar. 2, 2012

(65) Prior Publication Data

US 2012/0315719 A1    Dec. 13, 2012

(30) Foreign Application Priority Data

Jun. 7, 2011   (JP) ................................ P2011-127174

(51) Int. Cl.
*H01L 33/26* (2010.01)
*H01L 21/302* (2006.01)
*H01L 21/461* (2006.01)

(52) U.S. Cl.
USPC .................. 438/47; 438/40; 438/458; 257/13; 257/99; 257/E33.03

(58) Field of Classification Search
None
See application file for complete search history.

(56) References Cited

U.S. PATENT DOCUMENTS

| | | | |
|---|---|---|---|
| 2005/0048736 A1* | 3/2005 | Kerdiles et al. | 438/455 |
| 2005/0181547 A1* | 8/2005 | Asano et al. | 438/149 |
| 2009/0026486 A1* | 1/2009 | Jinushi | 257/99 |
| 2010/0219437 A1* | 9/2010 | Usuda et al. | 257/98 |
| 2012/0175590 A1* | 7/2012 | Saeki | 257/13 |

FOREIGN PATENT DOCUMENTS

JP    2010-283185    12/2010

* cited by examiner

*Primary Examiner* — Michael Trinh
*Assistant Examiner* — Pamela E Perkins
(74) *Attorney, Agent, or Firm* — Patterson & Sheridan, LLP

(57) ABSTRACT

According to one embodiment, in a method of a nitride semiconductor light emitting device, a nitride semiconductor laminated body is formed on a first substrate having a first size. A first adhesion layer with a second size smaller than the first size is formed on the nitride semiconductor laminated body. A second adhesion layer is formed on a second substrate. The first and the second substrates are bonded while the first and second adhesion layers being overlapped each other. The first substrate is removed so as to generate a recess having a third size equal to or larger than the second size. The first substrate is etched until exposing the nitride semiconductor laminated body while injecting a chemical solution into the recess. The exposed nitride semiconductor laminated body is etched using the chemical solution so as to form a concave-convex portion in the exposed nitride semiconductor laminated body.

20 Claims, 10 Drawing Sheets

$d1 > d2$, $\Delta d1 = (d1-d2)/2$ $d1 > d3 > d2$, $\Delta d2 = (d1-d3)/2$, $\Delta d1 > \Delta d2$

METHOD OF MANUFACTURING NITRIDE SEMICONDUCTOR LIGHT EMITTING DEVICE

CROSS REFERENCE TO RELATED APPLICATION

This application is based upon and claims the benefit of priority from the prior Japanese Application No. 2011-127174, filed on Jun. 7, 2011, the entire contents of which are incorporated herein by reference.

FIELD

Embodiments described herein relate generally to a method of manufacturing a nitride semiconductor light emitting device.

BACKGROUND

Heretofore, there are nitride semiconductor light emitting devices which include a nitride semiconductor laminated body provided on an opaque and conductive support substrate with a metal reflection film interposed therebetween. In the nitride semiconductor light-emitting device, light is extracted from the nitride semiconductor laminated body side and a path of electric current is formed from the nitride semiconductor laminated body to the support substrate.

The nitride semiconductor light-emitting device is manufactured in the following manner. The nitride semiconductor laminated body is firstly formed on a substrate for growth. A support substrate is bonded to the substrate for growth with the metal reflection film interposed therebetween. Finally the substrate for growth is removed.

In a case where the substrate for growth is a sapphire substrate, when the sapphire substrate is removed through a laser liftoff process, a problem arises in that cracks are generated in a peripheral portion of the nitride semiconductor laminated body due to thermal strain. When a laser beam having a spot diameter as small so as not to cause cracks is used, the occurrence of the cracks can be suppressed. However, the problem with the technique is that time required for the work increases.

In a case where the substrate for growth is a silicon substrate, it is easy to remove the silicon substrate using a wet etching process. However, the exposed surfaces (including the back surfaces and the side surfaces) of the substrate for growth and the support substrate which are bonded each other are inevitably exposed to an etchant.

For this reason, it is required for a portion of the body other than the substrate for growth to be coated with a protective film so that the portion may not be etched. However, the problem with the method is that the etchant soaks a gap between the portion and the protective film, so that the support substrate, the metal reflection film, or the like is likely to be damaged.

DETAILED DESCRIPTION

Figure 1:
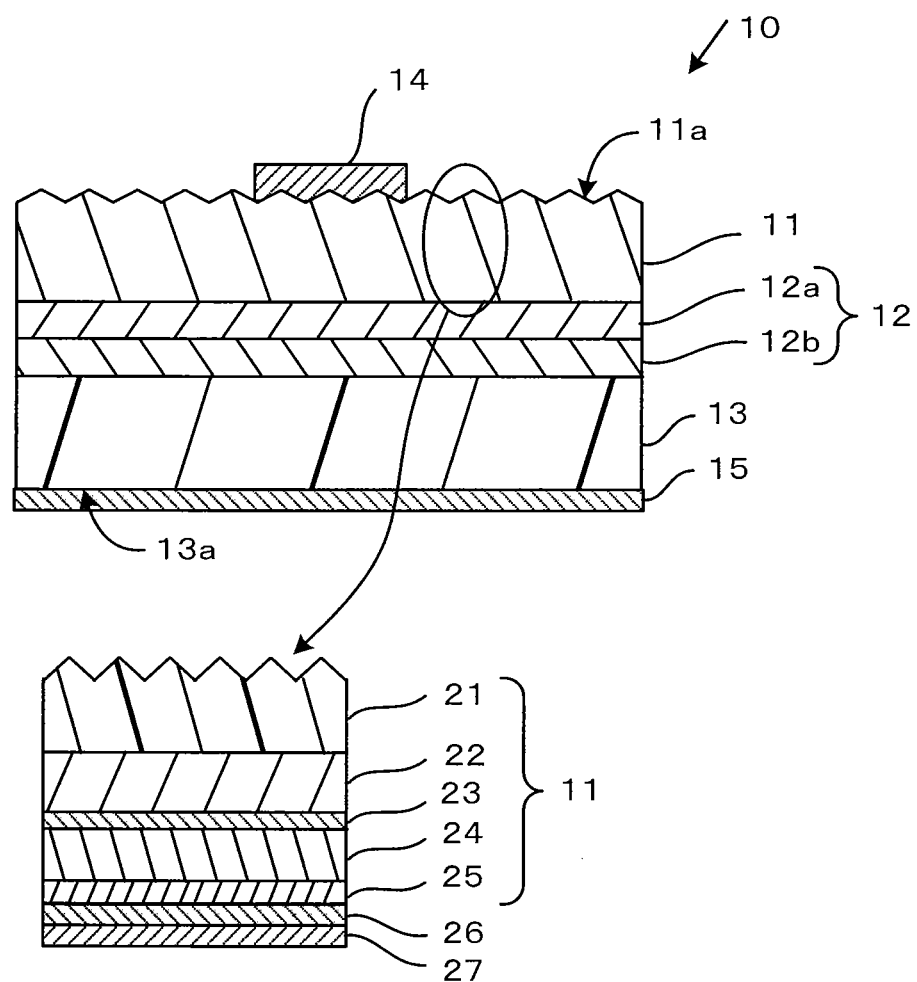
FIG. 1 is a cross-sectional view illustrating a nitride semiconductor light emitting device according to a first embodiment.

According to one embodiment, in a method of manufacturing a nitride light emitting device,
a nitride semiconductor laminated body is formed on a first substrate having a first size. A first adhesion layer is formed on the nitride semiconductor laminated body. A second adhesion layer is formed on a second substrate. The first adhesion layer has a second size smaller than the first size. The first and the second substrates are bonded while the first and second adhesion layers being overlapped each other. The first substrate is removed so as to generate a recess having a third size equal to or larger than the second size. The first substrate is etched until exposing the nitride semiconductor laminated body while injecting a chemical solution into the recess. The exposed nitride semiconductor laminated body is etched using the chemical solution so as to form a concave-convex portion in the exposed nitride semiconductor laminated body.

Hereinafter, embodiments will be described with reference to the drawings. In the drawings, same reference characters denote the same or similar portions.

[First Embodiment]

A method of manufacturing a nitride semiconductor light-emitting device of a first embodiment will be described with reference to FIGS. 1 to 5C. FIG. 1 is a cross-sectional view illustrating the nitride semiconductor light-emitting device of the first embodiment. FIGS. 2A to 5C are cross-sectional views illustrating steps of manufacturing the nitride semiconductor light-emitting device in the sequential order.

As illustrated in FIG. 1, in the nitride semiconductor light-emitting device 10 of the first embodiment, a nitride semiconductor laminated body 11 is formed on a support substrate 13 with an adhesion layer 12 interposed therebetween.

An upper surface 11a of the nitride semiconductor laminated body 11 is provided with a concave-convex portion in order to increase the light extraction efficiency. A first electrode 14 is formed on the upper surface 11a of the nitride semiconductor laminated body 11. A second electrode 15 is formed on the lower surface 13a of the support substrate 13.

The nitride semiconductor laminated body 11 is a multi-layered nitride semiconductor laminated body which includes a first nitride semiconductor unit of a first conductivity type, a second nitride semiconductor unit of a second conductivity type and a nitride semiconductor light emitting unit provided between the first and second nitride semiconductor units, for example. The first nitride semiconductor unit includes an N-type GaN 21 layer and an N-type GaN clad layer 22. The second nitride semiconductor unit includes a P-type GaN clad layer 24 and a P-type GaN contact layer 25. The nitride semiconductor light emitting unit includes a multiple quantum well (MQW) structure 23 in which a GaN barrier layer and an InGaN well layer are stacked one another.

A reflection layer 26 and a barrier layer 27 are formed on the P-type GaN contact layer 25. The reflection layer 26, for example, is a silver (Ag) film on which light emitted from the MQW structure 23 to the support substrate 13 side is reflected toward the nitride semiconductor laminated body 11 side. The barrier layer 27, for example, is a titanium nitride (TiN) film for preventing the diffusion of Ag.

The adhesion layer 12, for example, is a eutectic metal film which is made of gold-tin (AuSn) or the like. The adhesion layer 12 is an adhesion layer which is formed by combining a first adhesion layer 12a formed on the barrier layer 27 disposed close to the nitride semiconductor laminated body 11 and a second adhesion layer 12b formed on the support substrate 13.

The support substrate 13, for example, is an N-type silicon substrate having low specific resistance. The first electrode (the N-side electrode) 14, for example, is a laminated film which is made of titan (Ti)/platinum (Pt)/gold (Au) and formed on the N-type GaN layer 21 of the nitride semiconductor laminated body 11. The second electrode (the P-side electrode) 15, for example, is a gold (Au) film.

The nitride semiconductor laminated body 11 is well-known, but is briefly described below. The N-type GaN layer 21 is a base single crystal layer on which the N-type GaN clad layer 22 to P-type GaN contact layer 25 are grown, and formed in a thickness of approximately 3 μm for example. The N-type GaN clad layer 22 is formed in a thickness of approximately 2 μm, for example.

The MQW structure 23 is formed in such a multiple quantum well structure that a GaN barrier layer with a thickness of approximately 5 nm and InGaN well layer with a thickness of approximately 2.5 nm are stacked alternately and the InGaN well layer is located at top layer, for example.

The P-type GaN clad layer 24 is formed in a thickness of approximately 100 nm, for example. The P-type GaN contact layer is formed in a thickness of approximately 10 nm, for example.

A composition ratio x of In in each InGaN well layer (the $In_xGa_{1-x}N$ layer, $0<x<1$) is set at approximately 0.1 for the purpose of making a peak light-emission wavelength equal to approximately 450 nm, for example.

The nitride semiconductor light-emitting device 10 of the first embodiment is configured such that a large amount of light is extracted from the nitride semiconductor laminated body 11. When the first electrode 14 and the second electrode 15 are electrically connected to a power source, a current flows between the nitride semiconductor laminated body 11 and the support substrate 13, and light which is emitted from the MQW structure 23 to the support substrate 13 side is reflected on the reflection layer 26 toward the nitride semiconductor laminated body 11 side.

Next, a method of manufacturing the nitride semiconductor light emitting device 10 will be explained. FIGS. 2A to 5C are cross-sectional views illustrating steps of manufacturing the nitride semiconductor light emitting device 10 in the sequential order.

Figure 2A:
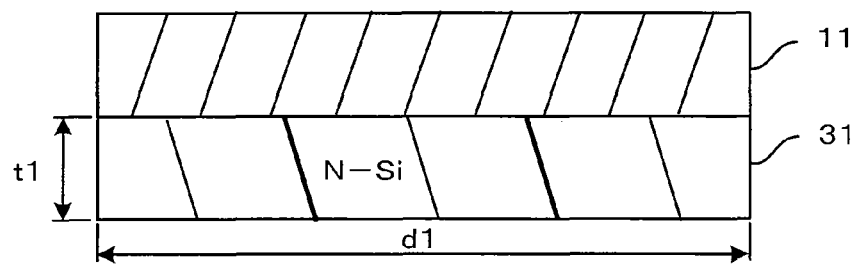
FIGS. 2A to 5C are cross-sectional views illustrating steps of manufacturing the nitride semiconductor light emitting device in the sequential order according to the first embodiment.

As shown in FIG. 2A, the N-type GaN layer 21 to P-type GaN contact layer 25 are epitaxially grown on a first substrate (substrate for growth) 31 with a diameter (a first size) d1 in the order via a buffer layer by a MOCVD (metal organic chemical vapor deposition) method so as to form the nitride semiconductor laminated body 11.

The first substrate 31 is a P-type silicon substrate with a resistivity of several ohm·cm, for example, of which a diameter d1 is approximately 150 mm and a thickness t1 is approximately 650 μm.

The method of forming the nitride semiconductor laminated body 11 is well known, but briefly described below. First of all, as a preliminary treatment, an N-type silicon substrate of (100)±2-degree OFF of a plane direction as the first substrate 31 is subjected to organic cleaning and acid cleaning, for example. Thereafter, the resultant first substrate 31 is contained in a reaction chamber of the MOCVD system.

Subsequently, the temperature of the first substrate 31 is raised to 1100° C., for example, by high-frequency heating in a normal-pressure atmosphere of a mixed gas of a nitrogen ($N_2$) gas and a hydrogen ($H_2$) gas. Thereby, the surface of the first substrate 31 is etched in gas phase, and a natural oxide film formed on the surface of the first substrate 31 is removed.

Afterward, the N-type GaN layer 21 with a thickness of 3 μm is formed by using the mixed gas of the $N_2$ gas and the $H_2$ gas as a carrier gas while supplying an ammonium ($NH_3$) gas and a trimethyl gallium (TMG) gas, for example, as process gases, and supplying a silane ($SiH_4$) gas, for example, as the n-type dopant.

After the N-type GaN clad layer 22 with a thickness of 2 μm is formed likewise, the temperature of the first substrate 31 is decreased to and kept at 800° C. which is lower than 1100° C., for example, while continuing supplying the $NH_3$ gas with the supply of TMG and the $SiH_4$ gas stopped.

Afterward, the GaN barrier layer with a thickness of 5 nm is formed by using the $N_2$ gas as the carrier gas while supplying the $NH_3$ gas and the TMG gas, for example, as the process gases. After that, the InGaN well layer with a thickness of 2.5 nm, in which the In composition ratio is 0.1, is formed by supplying a trimethyl indium (TMI) gas as another process gas.

Subsequently, the forming of the GaN barrier layer and the forming of the InGaN well layer are alternately repeated 7 times, for example, while intermittently supplying the TMI gas. Thereby, the MQW structure 23 is obtained.

Thereafter, the undoped GaN cap layer with a thickness of 5 nm is formed while continuing supplying the TMG gas and the $NH_3$ gas with the supply of TMI stopped.

After that, the temperature of the first substrate 31 is raised to and kept at 1030° C., for example, which is higher than 800° C., in the $N_2$ gas atmosphere while continuing supplying the $NH_3$ gas with the supply of the TMG gas stopped.

Subsequently, the p-type GaN clad layer 24 with a thickness of approximately 100 nm, in which the concentration of Mg is $1E20$ $cm^{-3}$, is formed by using the mixed gas of the $N_2$ gas and the $H_2$ gas as the carrier gas while supplying: the $NH_3$ gas and the TMG gas as the process gases; and a bis(cyclopentadienyl) magnesium (Cp2Mg) gas as the p-type dopant.

Thereafter, the p-type GaN contact layer 25 with a thickness of approximately 10 nm, in which the concentration of Mg is $1E21$ $cm^{-3}$, is formed while supplying an increased amount of Cp2Mg.

Afterward, the temperature of the first substrate 31 is lowered naturally with the supply of only the carrier gas continued while continuing supplying the $NH_3$ gas with the supply of the TMG gas stopped. The supplying of the $NH_3$ gas is continued until the temperature of the first substrate 31 reaches 500° C. Thereby, the nitride semiconductor laminated body 11 is formed on the first substrate 31 and the P-type GaN contact layer 25 is located in the top surface.

As the reflection layer 26, for example, an Ag film (not illustrated) is formed on the P-type GaN contact layer 25 through a vacuum deposition process. As the barrier layer 27, for example, a TiN film (not illustrated) is formed on the reflection layer 26 through a sputtering process.

Figure 2B:
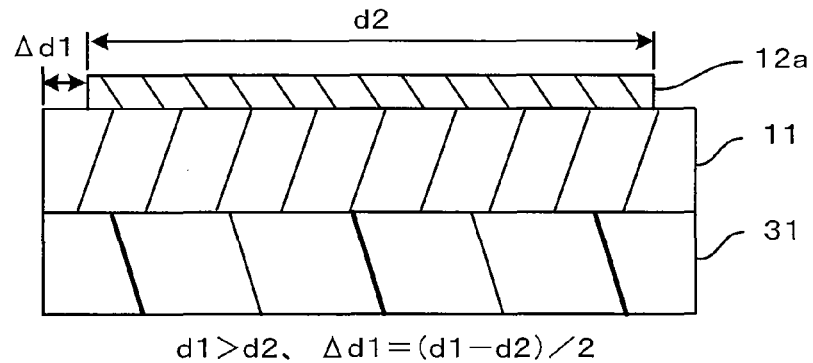

As illustrated in FIG. 2B, the first adhesion layer 12a is formed on the nitride semiconductor laminated body 11 such that the first adhesion layer 12a has a diameter (a second size) d2 smaller than a diameter d1. The diameter d2 is set to expose the outer peripheral portion of the nitride semiconductor laminated body 11 by Δd1.

Δd1 can be expressed by (d1−d2)/2. In a case where Δd1 is assumed to be 1.5 mm, for example, the diameter d2 becomes 147 mm.

Specifically, on the nitride semiconductor laminated body 11, for example, an AuSn film is formed to be about 2 μm thick through a sputtering process. Then, the AuSn film is etched and removed by about 1.5 mm from the outer edge to the inside, thereby forming the first adhesion layer 12a.

Alternatively, using a metal mask which has an opening with an internal diameter of 147 mm, an AuSn film may be formed on the nitride semiconductor laminated body 11 through a sputtering process, thereby forming the first adhesion layer 12a.

Figure 2C:
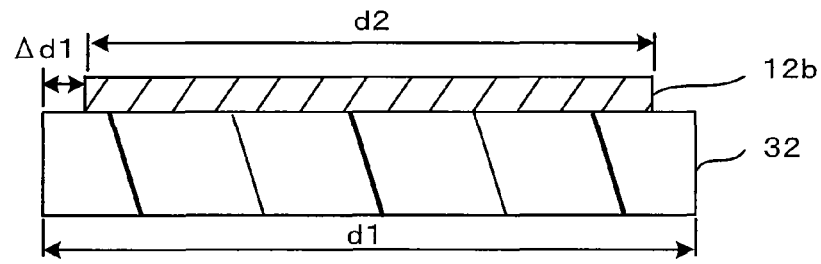

As illustrated in FIG. 2C, a second substrate (the support substrate) 32 which is same as the first substrate 31 is prepared. Then, the second adhesion layer 12b having a diameter of d2 is formed on the second substrate 31.

Figure 3A:
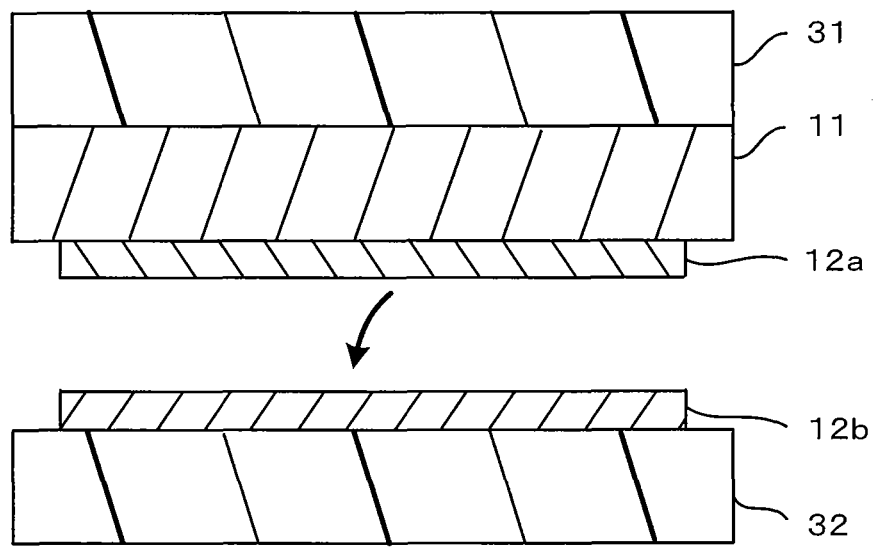

As illustrated in FIG. 3A, the first substrate 31 is vertically reversed. The first adhesion layer 12a is put on the second adhesion layer 12b so as to bond the first substrate 31 and the second substrate 32.

Specifically, the first substrate 31 and the second substrate 32 are heated and pressed. The first adhesion layer 12a and the second adhesion layer 12b are fused with each other so as to become the adhesion layer 12, and thus the first substrate 31 and the second substrate 32 are bonded each other.

Figure 3B:
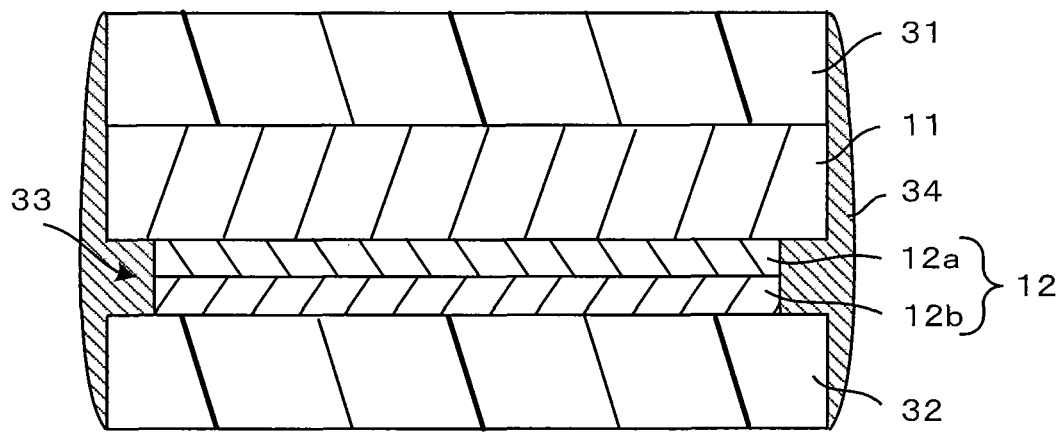

As illustrated in FIG. 3B, a reinforcing member 34 is filled in a gap 33 interposed between the outer peripheral portions of the first substrate 31 and the second substrate 32. The reinforcing member is a wax material such as paraffin, for example. The reinforcing member 34 overflows to cover the side surfaces of the first substrate 31 and the second substrate 32.

When the center portion of the first substrate 31 is ground in subsequent processes, the outer peripheral portions of the first substrate 31 and the nitride semiconductor laminated body 11 are formed in a cantilever shape, so that the reinforcing member 34 is provided to prevent damage.

Figure 4A:
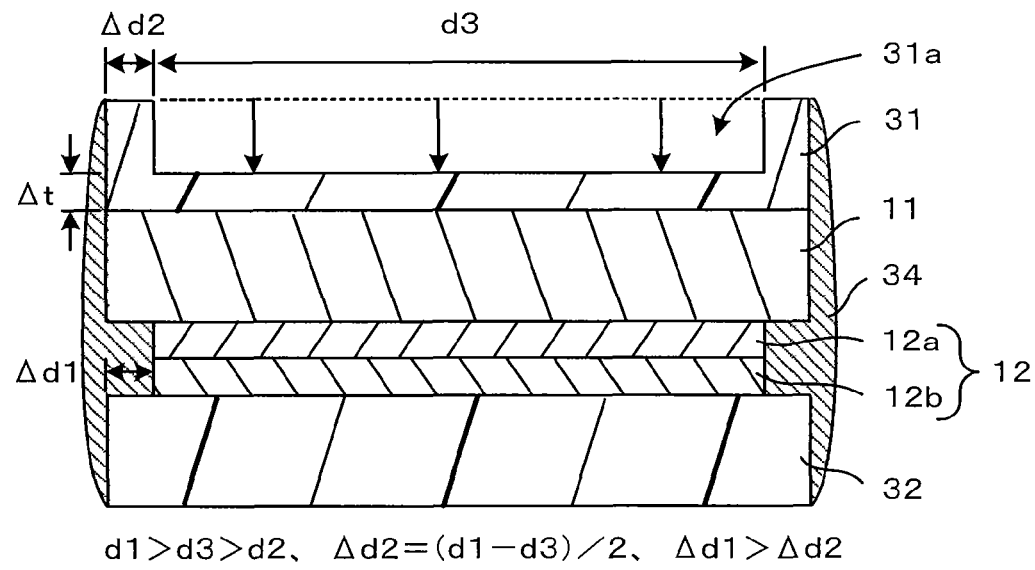

As illustrated in FIG. 4A, the center portion of the first substrate 31 is removed so that a recess 31a having a diameter (the third size) d3 larger than the diameter d2 is generated. Specifically, the center portion of the first substrate 31 is partway ground using a grinder having an outer diameter of d3.

The diameter d3 is set such that the outer peripheral portion of the first substrate 31 is left by Δd2 smaller than Δd1. Δd2 can be expressed by (d1−d3)/2. In a case where Δd2 is set to 1 mm, for example, the diameter d3 becomes 148 mm.

The reason for leaving the outer peripheral portion of the first substrate 31 by Δd2 is to maintain the strength of the first substrate 31, and to form a chemical solution storage unit which is used when etching the center portion of the first substrate 31 in order to expose the nitride semiconductor laminated body 11 through the recess 31a in the subsequent processes.

The remaining thickness Δt of the first substrate 31 is not particularly limited. From the point of view of bending of the first substrate 31 and accuracy of grinding, the remaining thickness Δt is preferably 10 μm or more. Further, in view of etching the center portion of the first substrate 31 in the subsequent processes using the chemical solution, the remaining thickness Δt is preferably 30 μm or less.

Figure 4B:
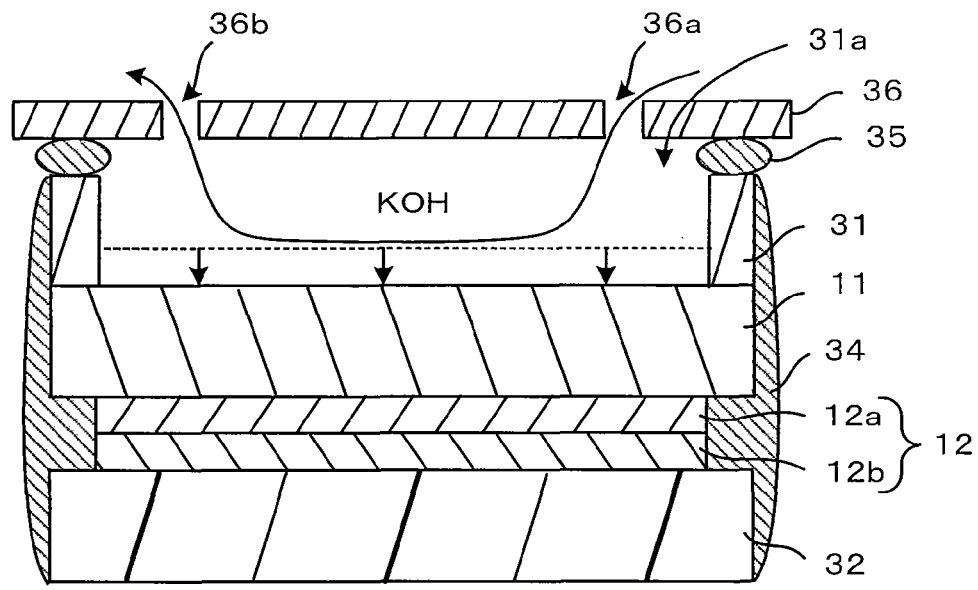

As illustrated in FIG. 4B, an aqueous solution of potassium hydroxide (KOH) is injected into the recess 31a and the first substrate 31 is etched until the nitride semiconductor laminated body 11 is exposed.

Specifically, a cover 36 is placed on the outer peripheral portion of the first substrate 31 with an O ring 35 therebetween, thereby sealing the recess 31a. The outer peripheral portion of the first substrate 31 becomes a wall, and the O ring 35 serves to prevent leakage. The O ring 35 and the cover 36 are made of an alkaline resistant resin, for example, a fluorinated resin.

The cover 36 includes an injection port 36a through which the chemical solution is injected and a discharge port 36b through which the chemical fluid is discharged. Using an alkaline resistant pump, the KOH aqueous solution is injected from the injection port 36a into the recess 31a. The injected KOH aqueous solution etches the silicon bottom surface of the recess 31a. The reacted KOH aqueous solution is discharged from the discharge port 36b.

The KOH aqueous solution is suitable to have, for example, a concentration of approximately 20% to 40% at a temperature of approximately 60° C. to 70° C. Since the silicon bottom surface is subjected to an anisotropic etching using the KOH aqueous solution, the etching process is performed while forming a pit in a pyramid shape.

The KOH aqueous solution flows appropriately to supply a new solution, so that the silicon bottom surface of the recess 31a may be clearly removed as time goes on.

Figure 5A:
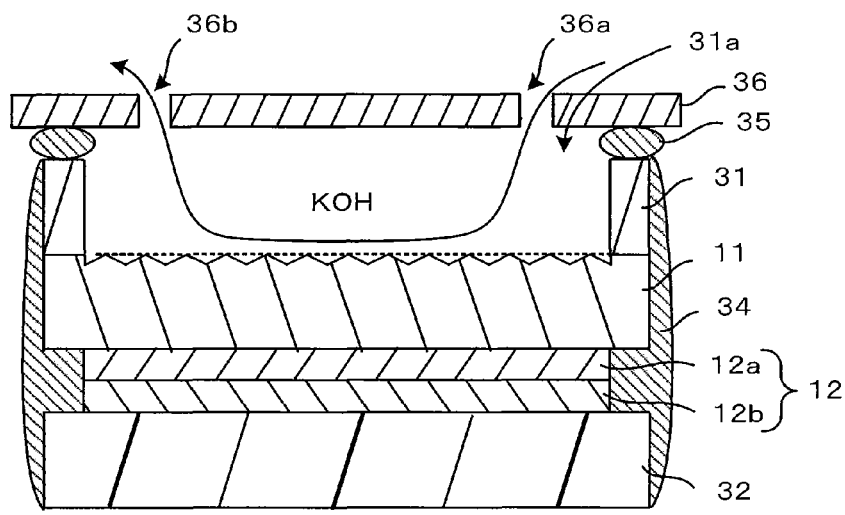

As illustrated in FIG. 5A, the N-type GaN layer 21 of the nitride semiconductor laminated body 11 is subsequently exposed and etched by the KOH aqueous solution. Since GaN has a low etching rate with respect to the KOH aqueous solution, the concave-convex portion may be formed on the nitride semiconductor laminated body 11 due to the uneven etching.

Figure 5B:
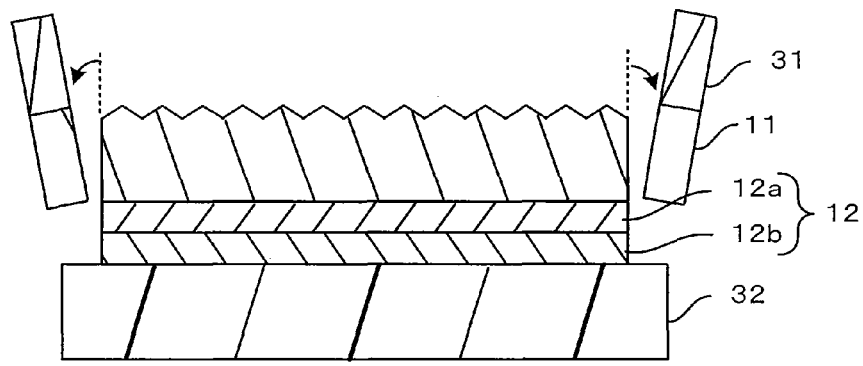

As illustrated in FIG. 5B, after the cover 36 and the O ring 35 are detached, the reinforcing member 34 is removed using an organic solvent, for example. At this time, just a little mechanical impact causes a fracture in the outer peripheral portion of the nitride semiconductor laminated body 11, so that the outer peripheral portions of the first substrate 31 and the nitride semiconductor laminated body 11 can be removed.

Figure 5C:
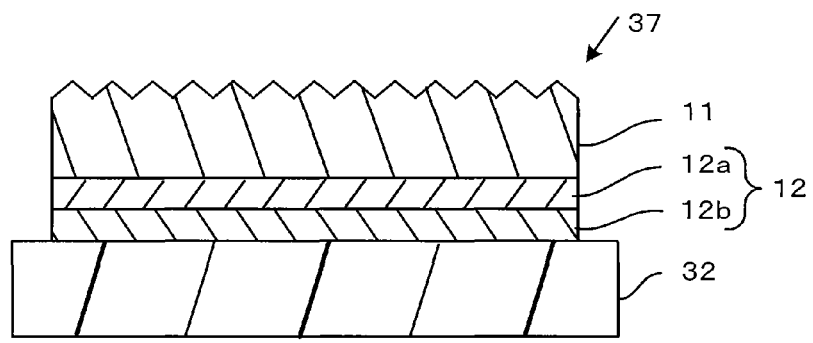

Therefore, as illustrated in FIG. 5C, a nitride semiconductor substrate 37 is obtained in which the nitride semiconductor laminated body 11 is formed on the second substrate 32 with the adhesion layer 12 therebetween.

On the nitride semiconductor laminated body 11 of the nitride semiconductor substrate 37, a laminated film made of Ti/Pt/Au is formed through a sputtering process, for example, and a patterning process is performed thereon using a photolithography technique, thereby forming a plurality of the first electrodes 14 which are arranged in a lattice shape. On the entire surface of the second semiconductor substrate 32, for example, an Al film is formed through a sputtering process, thereby forming the second electrode 15.

The nitride semiconductor substrate 37, in which the first electrode 14 and the second electrode 15 are formed, is subjected to a dicing process using a blade so as to obtain individual pieces. Accordingly, the nitride semiconductor light-emitting device 10 is obtained as illustrated in FIG. 1.

As described above, in the method of manufacturing the nitride semiconductor light-emitting device of the first embodiment, the center portion of the first substrate 31 bonded to the second substrate 32 is ground to form the recess 31a. Therefore, the outer peripheral portion is remained, so that the first substrate 31 becomes thin partially. In addition, the chemical solution is injected into the recess 31a to etch the first substrate 31, so that the first substrate 31 is completely removed.

As a result, since the second substrate 32, the adhesion layer 12, the reflection layer 26, and the barrier layer 27 are not exposed to the chemical solution, it is not likely that these components suffer damage. Therefore, it is possible to attain the method of manufacturing the nitride semiconductor light-emitting device by which the nitride semiconductor laminated body formed on a substrate for growth can be easily removed.

Hereinbefore, the description has been made in connection with the case where the reinforcing member 34 is filled in the gap 33 in order to prevent the outer peripheral portions of the first substrate 31 and the nitride semiconductor laminated body 11 from breaking during the process. In a case where the nitride semiconductor laminated body 11 is relatively thick (100 μm to 200 μm) and the outer peripheral portions of the first substrate 31 and the nitride semiconductor laminated body 11 are not likely to break, the reinforcing member 34 may not be provided.

Hereinbefore, the description has been made in connection with the case in which the recess 31a is formed in the first substrate 31 through a grinding process using the grinder. However, the recess 31a may be formed through a chemical mechanical polishing (CMP) process or a laser sputtering process.

In addition, the description has been made in connection with the case where the first substrate 31 and the second substrate 32 have the same diameter d1 and the first adhesion layer 12a and the second adhesion layer 12b have the same diameter d2. However, the second substrate 32 may be larger than the first substrate 31 and the second adhesion layer 12b may be larger than the first adhesion layer 12a.

In addition, the description has been made in connection with the case where the diameter d3 is larger the diameter d2. However, a configuration in which the diameter d3 is equal to the diameter d2 is also allowable.

In addition, the description has been made in connection with the case where the chemical solution is the KOH aqueous solution. However, the chemical solution may be a mixture of hydrofluoric acid and nitric acid.

In addition, the description has been made in connection with the case where the concave-convex portion is formed on the exposed surface of the nitride semiconductor laminated body 11 in order to improve the light extraction efficiency. However, in a case where there is no need to provide the concave-convex portion on the exposed surface of the nitride semiconductor laminated body 11, the process illustrated in FIG. 5A is unnecessary.

(Second Embodiment)

A method of manufacturing a nitride semiconductor light-emitting device of a second embodiment will be described with reference to FIGS. 6 to 10.

Figure 6:
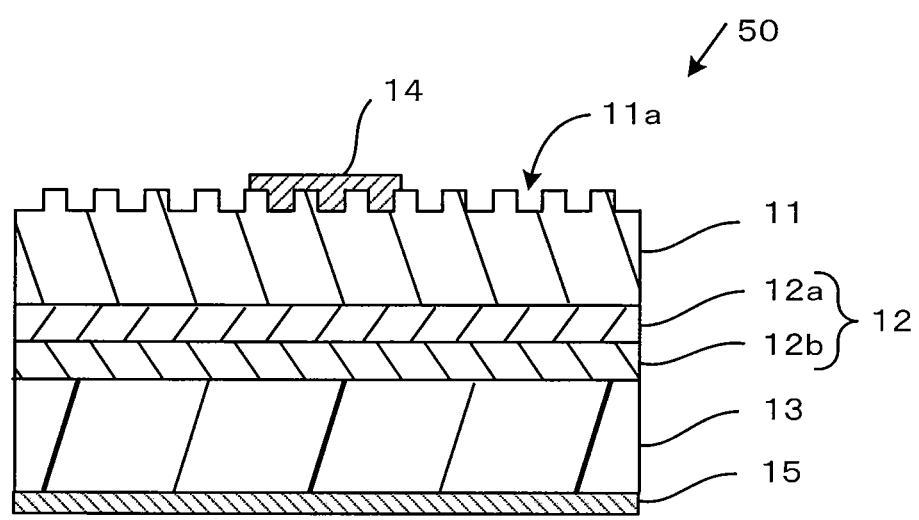
FIG. 6 is a cross-sectional view illustrating a nitride semiconductor light emitting device according to a second embodiment.

FIG. 6 is a cross-sectional view illustrating the nitride semiconductor light-emitting device, and FIGS. 7 to 10 are cross-sectional views illustrating steps of manufacturing the nitride semiconductor light-emitting device in the sequential order.

In the second embodiment, the same components as those of the first embodiment will be denoted with the same reference numerals, the description on the same components will not be provided herein, and only the different portions will be described. The second embodiment is different from the first embodiment in that a fine dot pattern (concave-convex portion) is formed on the exposed surface of the nitride semiconductor laminated body.

As illustrated in FIG. 6, the nitride semiconductor light-emitting device 50 of the second embodiment is configured such that the fine dot pattern is formed on the surface 11a of the nitride semiconductor laminated body 11. The dot size is equal to or a fraction of the wavelength of light which is emitted from the MQW structure 23 and propagated in the nitride semiconductor laminated body 11.

For example, in a case where the wavelength of the light emitted from the nitride semiconductor laminated body 11 is assumed to be 450 nm, since the refractive index of GaN is about 2.4, the wavelength of the light passing through the nitride semiconductor laminated body 11 is about 190 nm. Therefore, the dot size is preferable to be about 200 nm or less, and more preferable to be 50 nm or less.

With the fine dot pattern of the surface 11a of the nitride semiconductor laminated body 11, the refractive index of the boundary between the nitride semiconductor laminated body 11 and the atmosphere gradually varies in an equivalent manner. As a result, the total reflection on the nitride semiconductor laminated body 11 is effectively suppressed.

The concave-convex portion formed by the chemical solution as illustrated in FIG. 1 have a random size. As a result, diffuse reflection predominantly occurs on the boundary between the nitride semiconductor laminated body 11 and the atmosphere.

Therefore, with the nitride semiconductor light-emitting device 50 of the second embodiment, the light extraction efficiency may be improved compared with the nitride semiconductor light-emitting device 10 illustrated in FIG. 1.

Next, a method of manufacturing the nitride semiconductor light-emitting device 50 of the second embodiment will be described. FIGS. 7A to 10 are cross-sectional views illustrating steps of manufacturing the nitride semiconductor light-emitting device 50 in the sequential order.

The fine dot pattern of the surface 11a of the nitride semiconductor laminated body 11 is formed by a well-known technique as follows. A mask member having a periodic opening pattern is formed on the surface 11a of the nitride semiconductor laminated body 11, and using the mask member, the nitride semiconductor laminated body 11 is subjected to an anisotropic etching process.

Figure 7A:
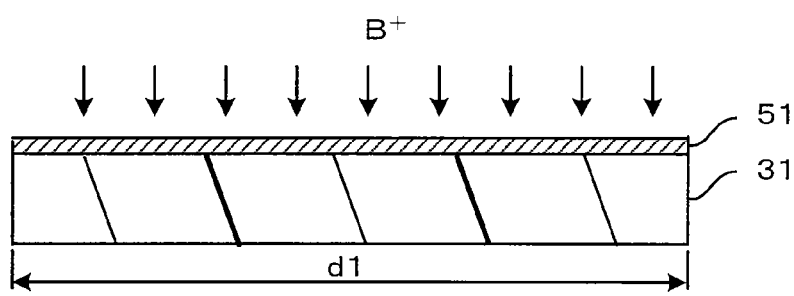
FIGS. 7A to 10 are cross-sectional views illustrating steps of manufacturing the nitride semiconductor light emitting device in the sequential order according to the second embodiment.

As illustrated in FIG. 7A, ions of boron (B) are implanted into the first substrate 31 so as to form a modified layer 51 which has an etching rate lower than that of the first substrate 31 with respect to the KOH aqueous solution. The implantation of B ions is performed on condition that, for example, the peak concentration ($1 \times 21$ cm$^{-3}$ or more) of B can be obtained within 100 nm deep from the surface of the first substrate 31.

The etching rate of the silicon having a high concentration of B with respect to the KOH aqueous solution is lower than that of the silicon with a low concentration of B. For example, in a case where the concentration of B is $1 \times 19$ cm$^{-3}$ or more, it is expected that the etching rate with respect to the KOH aqueous solution having a concentration of 40% at a temperature of 60° C. is reduced to about 1/100.

Therefore, the modified layer 51 serves as an etching stopper layer when the silicon is etched in the subsequent processes.

Figure 7B:
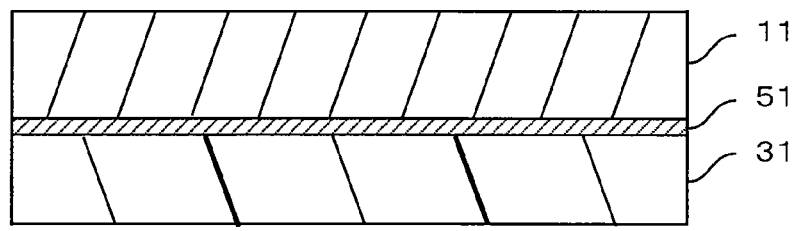

As illustrated in FIG. 7B, the nitride semiconductor laminated body 11 is formed on the first substrate which is provided with the modified layer 51 on the surface, using a MOCVD method in accordance with the process illustrated in FIG. 2B.

Figure 7C:
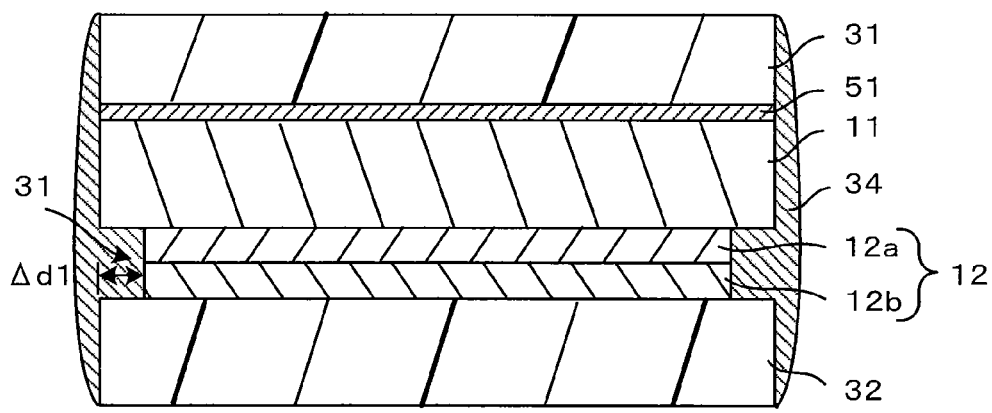

As illustrated in FIG. 7C, the first substrate 31 and the second substrate 32 are disposed to face each other and then the reinforcing member 34 is filled in the gap 33, similarly to the processes illustrated in FIGS. 2B to 3B.

Figure 8A:
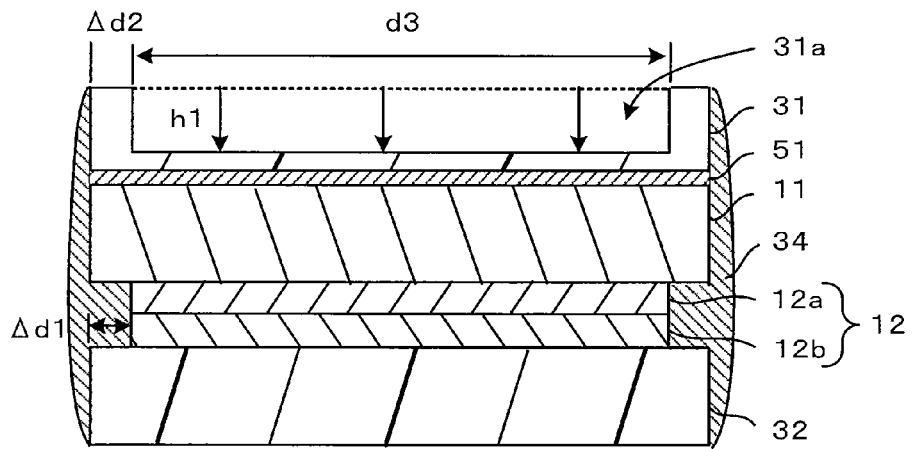

As illustrated in FIG. 8A, similarly to the process illustrated in FIG. 4A, the recess 31a is formed on the first substrate 31.

Figure 8B:
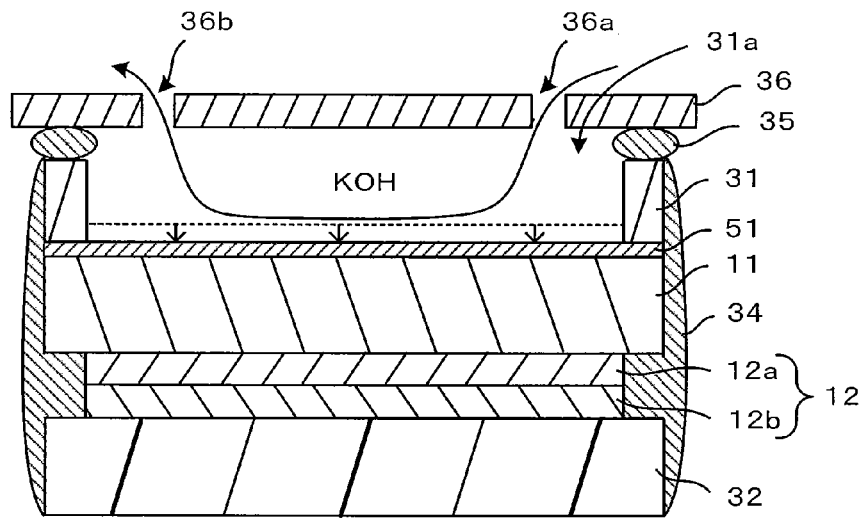

As illustrated in FIG. 8B, similarly to the process illustrated in FIG. 4B, the silicon bottom surface of the recess 31a of the first substrate 31 is etched using the KOH aqueous solution. The etching is stopped when the modified layer 51 is exposed.

Figure 8C:
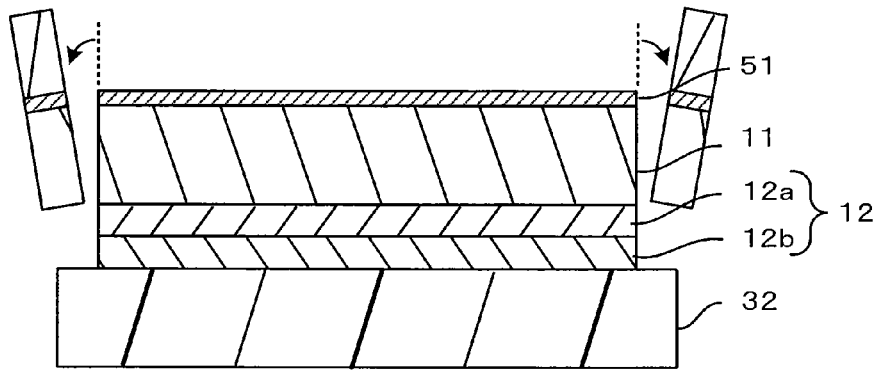

As illustrated in FIG. 8C, similarly to the process illustrated in FIG. 5B, the outer peripheral portions of the first substrate 31 and the nitride semiconductor laminated body 11 are removed.

Figure 9A:
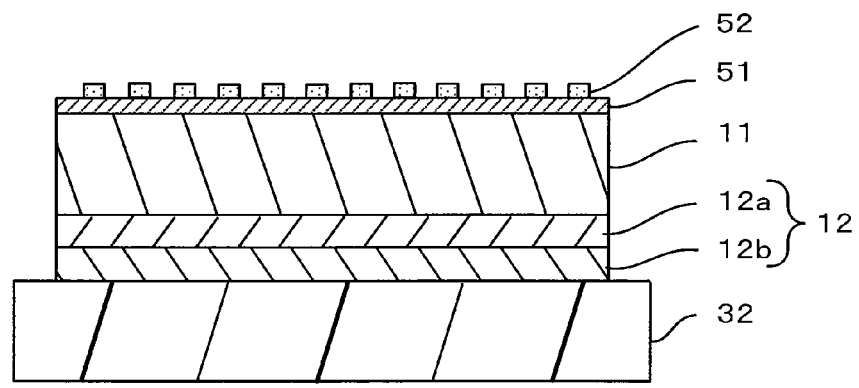

As illustrated in FIG. 9A, the mask member 52 is formed so as to be in the fine dot pattern on the modified layer 51 which is formed on the surface of the nitride semiconductor laminated body 11. The mask member 52 is a resist film, for example, which is patterned by a photolithography technique.

In a case where the dot size is 50 nm or less, a block copolymer of an aromatic polymer and an acrylic polymer is suitable as the mask member 52. Using the self-organization caused by the block copolymer, the dot pattern may be formed to a size in a nanometer scale.

Specifically, the block copolymer is dissolved using an organic solvent, and the surface of the nitride semiconductor laminated body 11 is coated using a spin coating method. A phase separation structure is generated in the block copolymer through a thermal annealing process (at a temperature of 100° C. to 200° C.).

After the aromatic polymer and the acrylic polymer are phase-separated, a sea-island structure is formed in a nanometer scale in which the acrylic polymer islands are scattered in the aromatic polymer sea.

The phase-separated block copolymer is subjected to the anisotropic etching through a reactive ion etching (RIE) process. Since etching resistance of the aromatic polymer is different from that of the acrylic polymer, the acrylic polymer is selectively etched. Finally, the remaining aromatic polymer becomes the mask member 52 having the fine dot pattern.

Figure 9B:
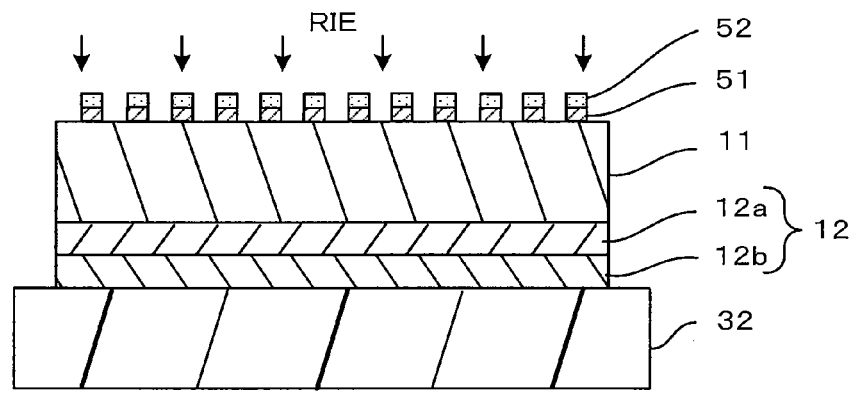

As illustrated in FIG. 9B, the modified layer 51 is subjected to the anisotropic etching through the RIE process using a fluorinated gas (for example, $CHF_3$, $CF_4$, $SF_6$, and the like). The pattern of the mask member 52 is transferred on the modified layer 51.

Figure 9C:
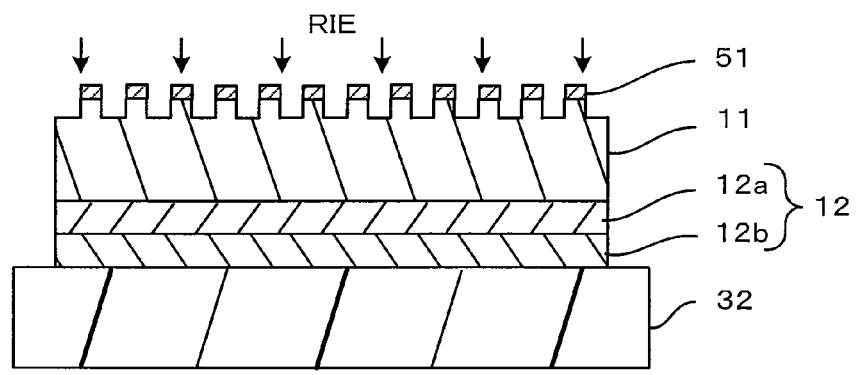

As illustrated in FIG. 9C, after the mask member 52 is removed by, for example, an ashing method. With the use of the modified layer 51, on which the pattern of the mask member 52 is transferred, as a mask, the N-type GaN layer 21 of the nitride semiconductor laminated body 11 is subjected to the anisotropic etching through the RIE process using a gas of chlorine system (for example, $SiCl_4$, $BCl_3$, and $Cl_2$). Therefore, the fine dot pattern is formed on the surface 11a of the nitride semiconductor laminated body 11.

Figure 10:
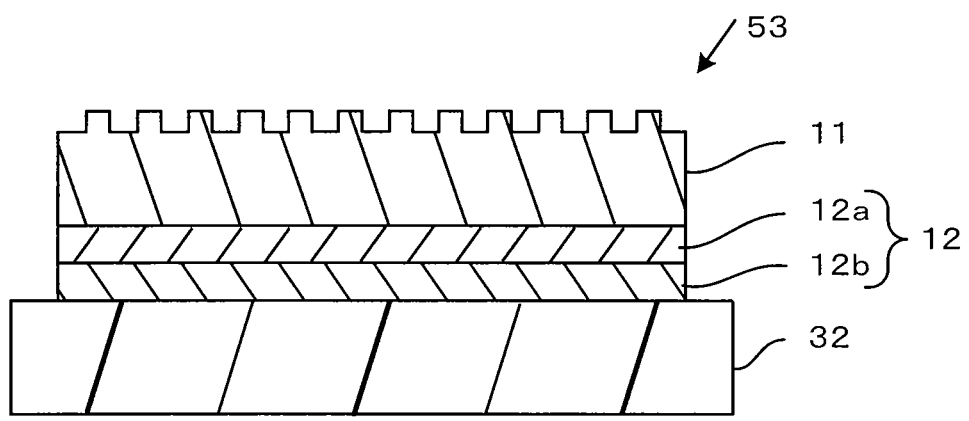

As illustrated in FIG. 10, the modified layer 51 used as a mask is completely removed through the RIE process using the fluorinated gas. Therefore, the nitride semiconductor substrate 53 is obtained in which the nitride semiconductor laminated body 11 having the fine dot pattern on the surface is formed on the second substrate 32 with the adhesion layer 12 interposed therebetween.

The multiple first electrodes 14 are formed in a lattice shape on the nitride semiconductor laminated body 11 of the nitride semiconductor substrate 53. The second electrode 15 is formed on the entire surface of the second semiconductor substrate 32. The nitride semiconductor substrate 53, in which the first electrode 14 and the second electrode 15 are formed, is subjected to a dicing process using a blade so as to obtain individual pieces. Therefore, the nitride semiconductor light-emitting device 50 illustrated in FIG. 6 is obtained.

As described above, in the method of manufacturing the nitride semiconductor light-emitting device of the second embodiment, the modified layer 51 is formed on the surface of the first substrate 31 so as to serve as the etching stopper layer with respect to the KOH aqueous solution. As a result, it is advantageous in that the fine dot pattern is easily formed on the nitride semiconductor laminated body 11 using the modified layer 51 as a mask.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A method of manufacturing a nitride semiconductor light emitting device, comprising:
   forming a nitride semiconductor laminated body on a first substrate that has a first size;
   forming a first adhesion layer on the nitride semiconductor laminated body and a second adhesion layer on a second substrate, the first adhesion layer having a second size smaller than the first size;
   bonding the first substrate and the second substrate so as to generate a gap between the first substrate and the second substrate with the first adhesion layer and the second adhesion layer being in contact with each other;
   removing a portion of the first substrate mechanically so as to generate a recess having a third size equal to or larger than the second size;
   etching the first substrate while injecting a chemical solution into the recess until the nitride semiconductor laminated body is exposed; and
   etching the exposed nitride semiconductor laminated body using the chemical solution so as to form a concave-convex portion in the exposed nitride semiconductor laminated body.

2. The method of claim 1, further comprising:
   filling the gap between the first substrate and the second substrate with a reinforcing member; and
   removing the reinforcing member after the nitride semiconductor laminated body is exposed by etching the first substrate.

3. The method of claim 2, wherein the reinforcing member is made of wax material.

4. The method of claim 2, wherein outer peripheral portions of the first substrate and the nitride semiconductor laminated body outside the first and second adhesion layers are removed when removing the reinforcing member.

5. The method of claim 1, wherein the portion of the first substrate is mechanically removed through a mechanical grinding process, a chemical mechanical polishing process or a laser sputtering process.

6. The method of claim 1, wherein the recess of the first substrate is sealed with a cover having an injection port and a discharge port, and the first substrate is etched by injecting the chemical solution into the recess from the injection port and discharging the chemical solution from the discharge port.

7. The method of claim 1, wherein the first and second substrates are silicon substrates, the chemical solution is an aqueous solution of potassium hydroxide.

8. The method of claim 1, wherein a first electrode is formed on the exposed nitride semiconductor laminated body and a second electrode is formed on the second substrate.

9. The method of claim 1, wherein the nitride semiconductor laminated body includes a first nitride semiconductor unit of a first conductivity type, a second nitride semiconductor unit of a second conductivity type and a nitride semiconductor light emitting unit provided between the first and second nitride semiconductor units.

10. The method of claim 9, wherein the first nitride semiconductor unit includes an N-type GaN layer and an N-type GaN clad layer, the second nitride semiconductor unit includes a P-type GaN clad layer and a P-type GaN contact layer, and the nitride semiconductor light emitting unit includes a multiple quantum well structure in which a GaN barrier layer and an InGaN well layer are stacked on one another.

11. A method of manufacturing a nitride semiconductor light emitting device, comprising:
   implanting an impurity into a first substrate having a first size so as to form a modified layer having an etching rate lower than that of the first substrate;
   forming a nitride semiconductor laminated body on the modified layer of the first substrate;
   forming a first adhesion layer on the nitride semiconductor laminated body and a second adhesion layer on a second substrate, the first adhesion layer having a second size smaller than the first size;
   bonding the first substrate and the second substrate while the first adhesion layer and the second adhesion layer overlap each other;
   removing a portion of the first substrate so as to generate a recess having a third size equal to or larger than the second size;
   etching the first substrate until exposing the modified layer while injecting a chemical solution into the recess;
   etching the exposed modified layer anisotropically using a mask member formed on the exposed modified layer, the mask member having a pattern of a shape of two or more dots;
   etching the nitride semiconductor laminated body anisotropically using the modified layer etched anisotropically as a mask; and
   removing the modified layer etched anisotropically so as to expose the nitride semiconductor laminated body etched anisotropically.

12. The method of claim 11, further comprising:
   filling a reinforcing member in a gap between the first substrate and the second substrate after bonding the first substrate and the second substrate; and
   removing the reinforcing member after exposing the modified layer.

13. The method of claim 12, wherein the reinforcing member is made of wax material.

14. The method of claim 12, wherein outer peripheral portions of the first substrate and the nitride semiconductor laminated body outside the first and second adhesion layers are removed when removing the reinforcing member.

15. The method of claim 11, wherein the portion of the first substrate is removed through a mechanical grinding process, a chemical mechanical polishing process or a laser sputtering process.

16. The method of claim 11, wherein after sealing the recess of the first substrate with a cover having an injection port and an discharge port, the first substrate is etched by injecting the chemical solution into the recess from the injection port and discharging the chemical solution from the discharge port.

17. The method of claim 11, wherein the first and second substrates are silicon substrates, the chemical solution is an aqueous solution of potassium hydroxide.

18. The method of claim 11, wherein a first electrode is formed on the exposed nitride semiconductor laminated body and a second electrode is formed on the second substrate.

19. The method of claim 11, wherein the two or more dots have a size of equal to or less than 200 nm and are disposed in a dispersive manner.

20. The method of claim 11, wherein the nitride semiconductor laminated body includes a first nitride semiconductor unit of a first conductivity type, a second nitride semiconductor unit of a second conductivity type and a nitride semiconductor light emitting unit provided between the first and second nitride semiconductor units.

* * * * *